(12) United States Patent
Kang (10) Patent No.: US 10,504,715 B2
(45) Date of Patent: Dec. 10, 2019

(54) BACK-SIDE FRICTION REDUCTION OF A SUBSTRATE

(71) Applicant: Tokyo Electron Limited, Tokyo (JP)

(72) Inventor: Hoyoung Kang, Guilderland, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/826,091

(22) Filed: Nov. 29, 2017

(65) Prior Publication Data

US 2018/0082833 A1    Mar. 22, 2018

Related U.S. Application Data (63) Continuation-in-part of application No. 15/650,352, filed on Jul. 14, 2017.

(60) Provisional application No. 62/365,228, filed on Jul. 21, 2016.

(51) Int. Cl.
| | |
|---|---|
| *H01L 21/02* | (2006.01) |
| *G03F 7/26* | (2006.01) |
| *G03F 7/20* | (2006.01) |
| *H01L 21/027* | (2006.01) |
| *H01L 21/67* | (2006.01) |

(52) U.S. Cl.
CPC ......... *H01L 21/02016* (2013.01); *G03F 7/20* (2013.01); *G03F 7/26* (2013.01); *H01L 21/0274* (2013.01); *H01L 21/67196* (2013.01); *H01L 21/67207* (2013.01); *H01L 21/6715* (2013.01); *H01L 21/67109* (2013.01)

(58) Field of Classification Search
CPC ......... H01L 2924/0002; H01L 2924/00; H01L 51/0036; H01L 51/0043; H01L 51/0558
See application file for complete search history.

(56) References Cited

U.S. PATENT DOCUMENTS

| | | |
|---|---|---|
| 7,045,170 B1 | 5/2006 | Hankins et al. |
| 2005/0109277 A1 | 5/2005 | Kobrin et al. |
| 2008/0131623 A1* | 6/2008 | Zhang .................. B82Y 10/00 427/569 |
| 2014/0308822 A1 | 10/2014 | O'Hara |
| 2018/0025899 A1 | 1/2018 | Kang |
| 2018/0082833 A1 | 3/2018 | Kang |
| 2018/0315938 A1* | 11/2018 | Kim .................. H01L 51/0566 |

OTHER PUBLICATIONS

International Search Report and Written Opinion dated Mar. 6, 2019 in PCT/US2018/060629, 15 pages.

* cited by examiner

*Primary Examiner* — Tony Tran
(74) *Attorney, Agent, or Firm* — Oblon, McClelland, Maier & Neustadt, L.L.P.

(57) ABSTRACT

A processing chamber system includes a substrate mounting module configured to secure a substrate within a first processing chamber. The system also includes a first deposition module configured to apply a light-sensitive film to a front side surface of the substrate, and a second deposition module configured to apply a film layer to a backside surface of the substrate. The front side surface is opposite to the backside surface of the substrate. A substrate has a bare backside surface with a first coefficient of friction. A film layer is formed onto the backside surface of the substrate. The film layer formed on the backside surface of the substrate has a second coefficient of friction. The second coefficient of friction is lower than the first coefficient of friction.

7 Claims, 10 Drawing Sheets

BACK-SIDE FRICTION REDUCTION OF A SUBSTRATE

RELATED APPLICATIONS

This application claims priority to U.S. Provisional Application No. 62/365,228 filed on Jul. 21, 2016, U.S. Nonprovisional application Ser. No. 15/650,352 filed on Jul. 14, 2017, wherein each of the aforementioned Applications are incorporated, in their entirety, by reference herein.

BACKGROUND

Fabrication of integrated circuits (IC) in the semiconductor industry typically employs a series of process steps to pattern features to form ICs on silicon substrates. The iterative patterning process may introduce misalignment errors between the pattern levels and may not form the patterned features of the IC to achieve their intended purpose. As IC geometry sizes have decreased over time, the impact of pattern misalignment on device yield and performance has increased. Accordingly, any techniques to reduce pattern misalignment would be advantageous to IC manufacturers.

The "background" description provided herein is for the purpose of generally presenting the context of the disclosure. Work of the presently named inventors, to the extent it is described in this background section, as well as aspects of the description which may not otherwise qualify as conventional art at the time of filing, are neither expressly nor impliedly admitted as conventional art against the present disclosure.

SUMMARY

In one embodiment, a method of treating a substrate includes receiving the substrate into a substrate processing chamber. The substrate has a front side surface and a backside surface opposite to the front side surface. The method also includes forming a film layer on the backside surface of the substrate, forming a photoresist layer on the front side surface of the substrate, and developing the photoresist layer. The method also includes removing the film layer from the backside surface of the substrate.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

The following descriptions are meant to further clarify the present disclosure by giving specific examples and embodiments of the disclosure. These embodiments are meant to be illustrative, rather than exhaustive. The full scope of the disclosure is not limited to any particular embodiment disclosed in the specification, but rather is defined by the claims.

In the interest of clarity, not all of the features of the implementations described herein are shown and described in detail. It will be appreciated that in the development of any such actual implementation, numerous implementation-specific decisions will be made in order to achieve the developer's specific goals, such as compliance with application- and business-related constraints, and that these specific goals will vary from one implementation to another and from one developer to another.

The order of discussion of the different steps as described herein has been presented for the sake of clarity. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

Techniques herein include systems, substrates, and methods configured to reduce the backside friction of a substrate or wafer while it is secured to an electrostatic charge or vacuum chuck during processing. The backside friction reduction may enable the substrate to be pulled flush against the holder to reduce front side distortion caused by back side surface roughness or conditions that may cause patterning or overlay errors on the front side of the substrate.

When a wafer or substrate is positioned onto a stage of a plasma processing apparatus, the wafer or substrate is secured by a vacuum chuck or an electrostatic chuck to the stage to prevent movement during processing. However, a substrate or in particular, a larger wafer is not usually completely flat. Therefore, the substrate or wafer is initially contacting the chuck only at limited points when it is initially positioned onto the stage.

A plasma processing apparatus can also be configured to process a substrate or wafer on a front side as well as a backside simultaneously. A detailed description is given herein with reference to FIG. 7.

Figure 1:
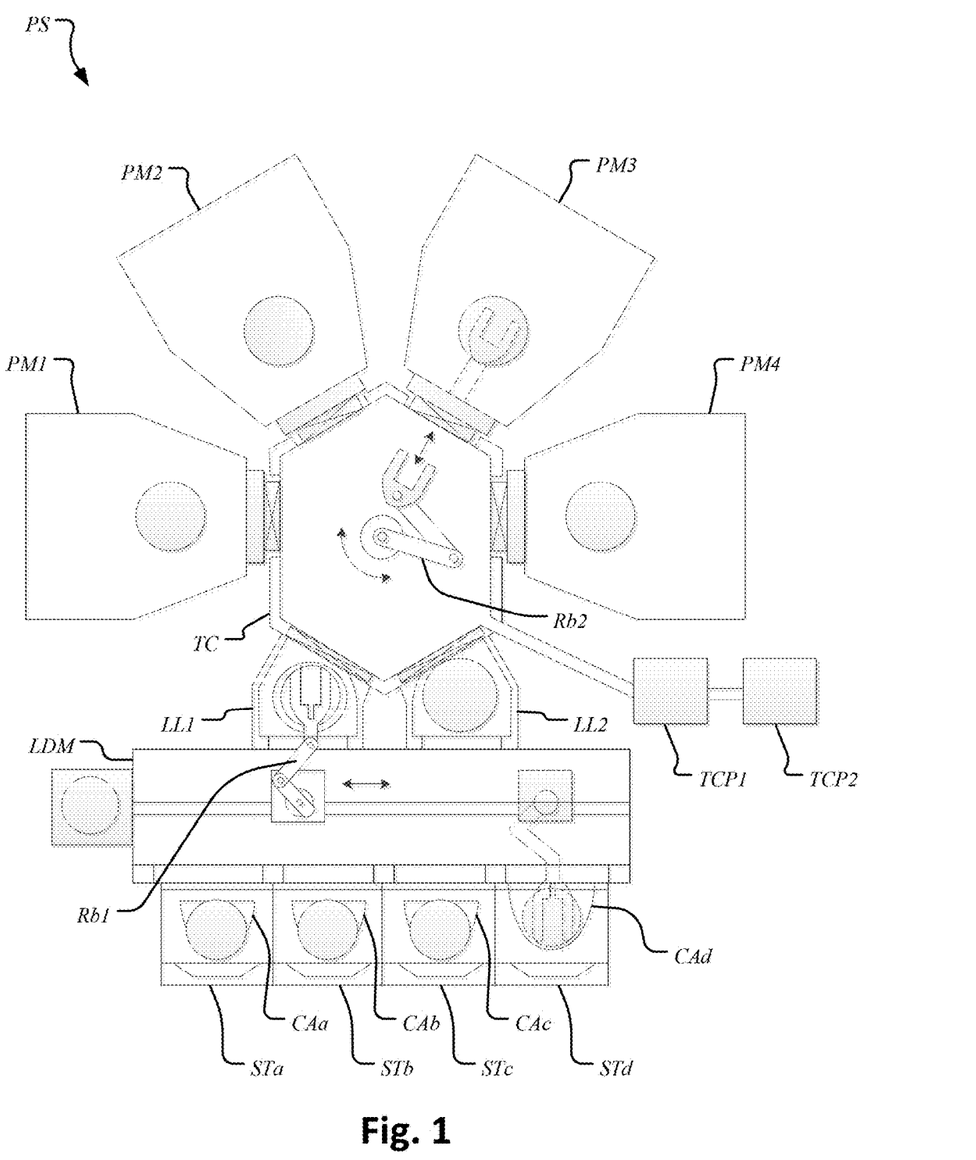
FIG. 1 illustrates an exemplary processing system according to one embodiment.

FIG. 1 illustrates an exemplary processing system PS. Processing system PS includes a plurality of substrate placing tables STa, STb, STc, and STd and a plurality of containers CAa, CAb, CAc, and CAd. Processing system PS also includes a loader module LDM and load lock chambers LL1 and LL2. Processing system PS also includes a plurality of process modules PM1, PM2, PM3, and PM4. A transfer chamber TC (i.e. a connecting part) and conveyance robots Rb1 and Rb2 are also illustrated in processing system PS.

The substrate placing tables STa through STd are arranged along one edge of the loader module LDM. The containers CAa through CAd are placed above the substrate placing tables STa through STd, respectively. Workpieces are accommodated within the containers CAa through CAd.

The conveyance robot Rb1 is provided inside the loader module LDM. The conveyance robot Rb1 takes out a workpiece accommodated within any one of the containers CAa through CAd and conveys the workpiece to the load lock chamber LL1 or LL2.

The load lock chambers LL1 and LL2 are provided along another edge of the loader module LDM. The load lock chambers LL1 and LL2 constitute a preliminary decompression chamber. The load lock chambers LL1 and LL2 are connected to the inside of the transfer chamber TC through corresponding gate valves.

The transfer chamber TC is a chamber of which the inside pressure (internal pressure) can be adjusted. The transfer chamber TC includes a pressure regulator TCP1 and an exhaust device TCP2 configured to perform ventilation and internal pressure adjustment of the transfer chamber TC. The conveyance robot Rb2 is provided inside the transfer chamber TC. Each of the process modules PM1 through PM4 includes a pressure regulator and an exhaust device configured to perform ventilation and internal pressure adjustment. The chambers of the process modules PM1 through PM4 are connected to the inside of the transfer chamber TC through corresponding gate valves. The transfer chamber TC connects the respective chambers of the process modules PM1 through PM4 to each other.

The conveyance robot Rb2 moves the workpiece between the load lock chambers LL1 and LL2 and any one of the process modules PM1 through PM4 through the transfer chamber TC. The conveyance robot Rb2 moves the workpiece between any two process modules PM1 through PM4 through the transfer chamber TC.

In one embodiment, process module PM1 can include a film exposure apparatus configured to expose a front side coating. The front side coating can be patterned via a mask to remove some areas of the front side coating while preserving other areas of the front side coating.

In one embodiment, process module PM2 can be configured to apply a backside film to a workpiece such as a wafer or substrate. The backside film can be applied to decrease the friction between the workpiece and the surface of a chuck during processing. For example, a fluorochemical film can be applied to the backside of the workpiece. The backside film can be applied by molecular vapor deposition or molecular liquid deposition in process module PM2. When the wafer or substrate is secured to a chuck, a bowing of the wafer or substrate having the backside film is less than a bowing of the wafer or substrate without the backside film.

In one embodiment, process module PM3 is configured to expose the wafer or substrate for additional patterning. For example, a previously-applied photoresist layer is exposed to actinic radiation. The backside film on the backside surface of the wafer or substrate is formed prior to exposure of the photoresist layer to a pattern of actinic radiation. The previously-applied backside film aids in securing the wafer or substrate to a chuck in a flattened non-distorted configuration, such that the patterning is more accurate.

In one embodiment, process module PM4 is an etching process module configured with an exposure apparatus to remove the previously exposed regions of the wafer or substrate.

In one embodiment, a post treatment module is configured as a backside film removal process module. For example, the post treatment module can be configured to remove a fluorochemical film from the backside of the workpiece. Fluorochemical film removal processes include, but are not limited to exposing the film layer to an oxygen-containing gas, exposing the film layer to an oxygen-containing plasma, or exposing the film layer to a combination of an oxygen-containing gas and ultra-violet light.

FIG. 1 illustrates four process modules PM1 through PM4. However, less than four or more than four process modules are contemplated by embodiments described herein. In addition, some process modules may be plasma airtight vacuum chambers, while other process modules may not be under a vacuum in the absence of an oxygen environment. For example, a pretreatment process module may be present in the processing system PS, which is configured to expose the backside surface of the workpiece to an oxygen pretreatment process to enhance the effectiveness of the subsequently applied backside film. Oxygen pretreatment processes include, but are not limited to, water, monoatomic oxygen, diatomic oxygen, or triatomic oxygen applied to the backside of the workpiece.

Figure 2A:
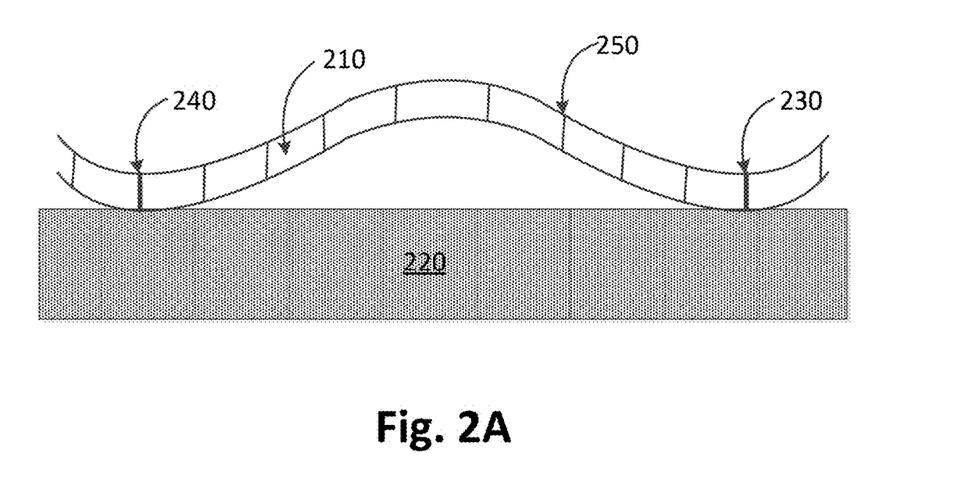
FIG. 2A illustrates an exemplary wafer positioned onto a chuck according to one embodiment.

FIG. 2A illustrates an exemplary wafer 210 positioned onto a chuck 220 (either a vacuum chuck or an electrostatic charge chuck). Points 230 and 240 illustrate points of contact of the wafer 210 with the chuck 220 when the wafer 210 is initially positioned or placed onto the chuck 220 without securing the wafer to the chuck 220 using electrical or mechanical means. Wafer 210 is in a relaxed state as illustrated by completely vertical relaxation markings 250 throughout the wafer 210. The wafer 210 deformation shown in FIG. 2A is not to scale and is merely shown for exemplary purposes to highlight stresses within the wafer 210 or stresses applied to the wafer 210 caused by overlying films (not shown) on the front side of the wafer 210 or underlying films (not shown) that may be on the back side of the wafer 210. The deformation may vary across the wafer 210 depending on the stress distributions of the wafer 210 and the aforementioned films.

Figure 2B:
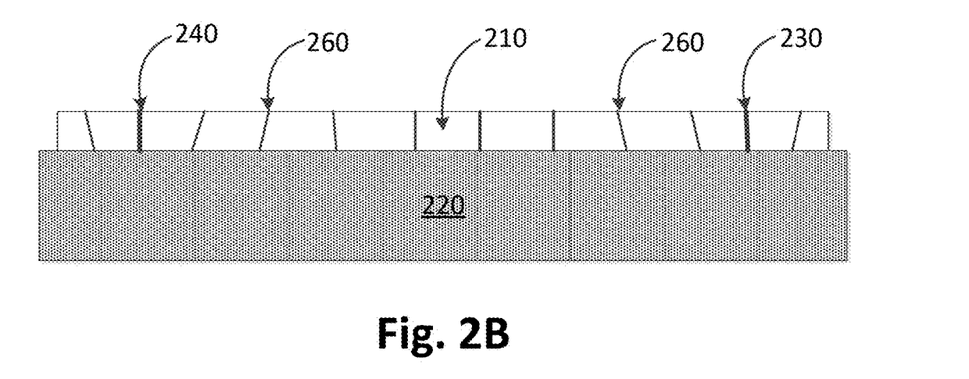
FIG. 2B illustrates a wafer secured to a vacuum or an electrostatic charge chuck according to one embodiment.

FIG. 2B is a wafer 210 secured to the chuck 220 using mechanical (e.g., vacuum) or electrical means (e.g., electrostatic charge chuck) (not shown). When the electrical or mechanical means is applied to the wafer 210, the remaining bottom surface of the wafer 210 is forced against the chuck 220, as illustrated in FIG. 2B. In this instance, the backside of the wafer 210 may be flush or substantially flush with the chuck 220, the back side being opposite of the front side of the wafer 210 where the IC devices are formed. However, the initial contact points 230 and 240 may tend to remain in their original affixed positions on the chuck 220. This may be caused by a high coefficient of friction of the backside of the wafer 210 with respect to the chuck 220 or varying degrees of the coefficient of friction across the backside of the wafer 210. Accordingly, the mechanical or electrical means of pulling the wafer 210 against the chuck 220 may introduce additional stress to the wafer 210 caused by the non-uniform coefficient of friction across the backside of the wafer 210 and the chuck 220. As a result, the wafer 210 tends to become distorted and compressed as it is forced against the chuck 220 between contact points 230 and 240 or points where these is a higher coefficient of friction between the backside of the wafer 210 and the chuck 220. FIG. 2B illustrates distortion markings 260 that are no longer completely vertical as compared to relaxation markings 250 in FIG. 2A. In this way, the distortion of the wafer 210 may distort overlying films (not shown) or patterns (not shown) on those overlying films, which may cause misalignment issues for subsequent patterns formed on those distorted overlying films or patterns.

FIGS. 2A and 2B illustrate just two contact points 230 and 240. However, an actual complete wafer 210 will have multiple initial contact points across its backside surface against the chuck 220. As a result, the wafer 210 is distorted, i.e. compressed across its entire surface area between each pair of contact points 230 and 240. This behavior causes problems with application of subsequent layers onto the wafer 210. Patterning of a layer, such as a photo resist layer needs to be aligned at certain points with respect to previously applied and patterned layers on the wafer 210. When the wafer 210 is distorted, subsequent patterning no longer aligns with previously patterned layers. For example, photoresist patterning for application of surface contact pads may not properly align with previously formed metallization layers and/or contact vias below the final surface of the wafer 210. Accordingly, when the misalignment errors become large enough the patterned features may not be formed properly and the performance of the IC may be degraded or the IC may not function as intended.

Figure 3:
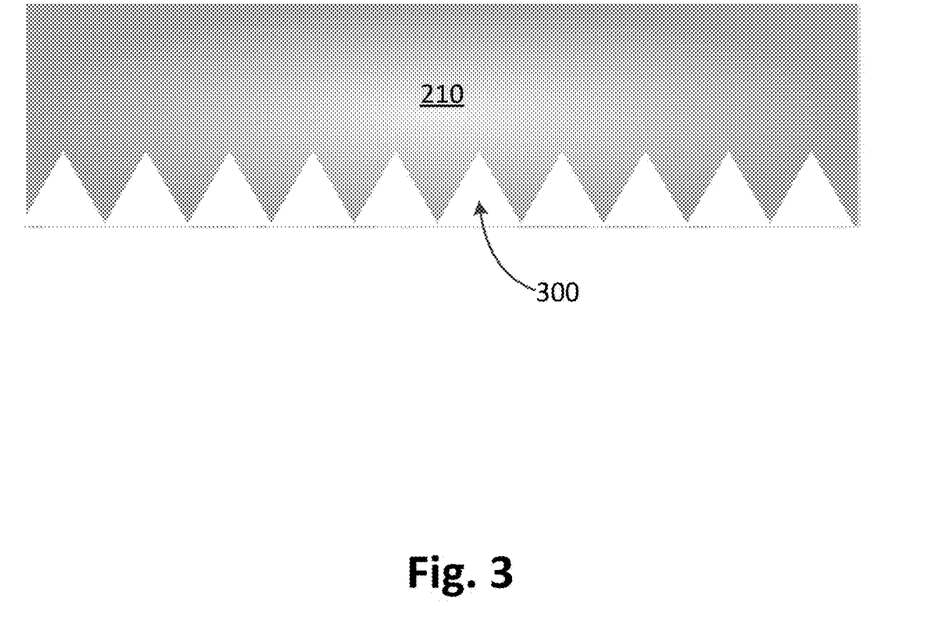
FIG. 3 illustrates a textured surface of a wafer according to one embodiment.

Attempts have been made to reduce the friction of the backside of wafer 210 with respect to the chuck 220 via texturing. Texturing produces a jagged surface, which reduces the number of contact points against the chuck 220. FIG. 3 illustrates a textured surface 300 of a wafer 210. Backside grinding is used to achieve the textured surface 300, but it has certain drawbacks. Backside grinding produces particles that can contaminate the wafer 210. Overgrinding can also occur. In addition, it is difficult to consistently reproduce the texturing, which may lead to inconsistent results to reduce misalignment errors. Also, texturing may have inherent limits to reducing friction between the wafer 210 and the chuck 220. Hence, other techniques that may reduce friction to a higher degree than texturing would be advantageous to reduce wafer 210 distortion caused by the chucking process.

Figure 4:
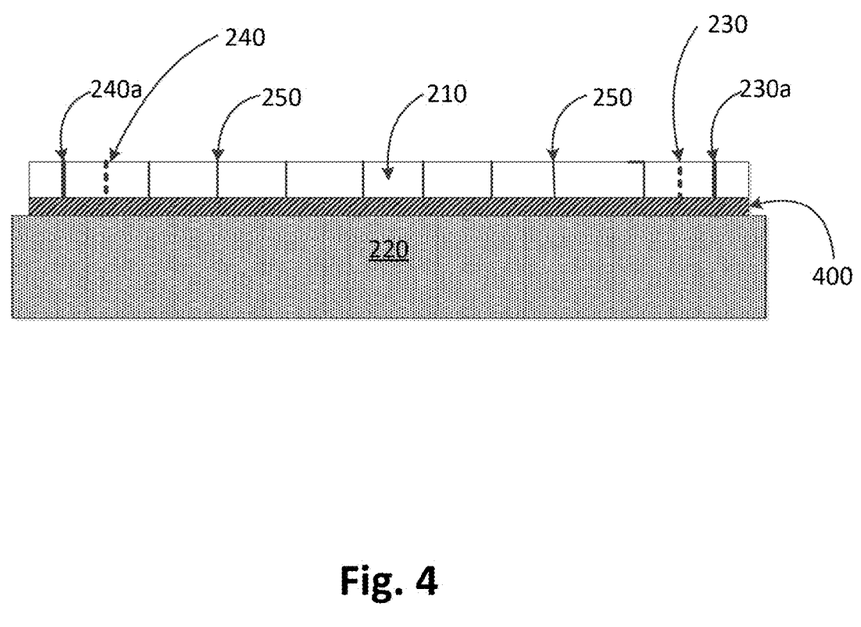
FIG. 4 illustrates a wafer secured flat against a chuck according to one embodiment.

FIG. 4 illustrates one embodiment to reduce the coefficient of friction between the wafer 210 and the chuck 220 when the wafer 210 is secured flat against the chuck 220. In this embodiment, a low friction film layer 400 may be applied to the wafer 210 prior to be placed or positioned on the chuck 220. Low friction film layer 400 is enlarged for illustrative purposes only. Features of FIG. 4 are not drawn to scale. Applying the low friction film may decrease the variation of the coefficient of friction between the wafer 210 and the chuck, such that when the wafer 210 is pulled flush or flat against the chuck the wafer 210 distortion illustrated in FIG. 2A is prevented or reduced. As shown in FIG. 4, the initial contact points 230 and 240 have expanded outward to new positions, illustrated respectively as contact points 230a and 240a as the wafer 210 is forced against or made flush with the surface of the chuck 220. As a result, relaxation markings 250 remain in their vertical relaxed state, as opposed to distortion markings 260 of FIG. 2B. Accordingly, the patterned features on the wafer 210 may have a lower amount of distortion which may improve the quality of subsequent patterns formed on the wafer 210. The low friction film layer 400 on the backside surface of the wafer 210 creates a lower coefficient of friction as compared to an original coefficient of friction before applying the low friction film layer 400 when the wafer 210 is secured to the chuck 220.

Figure 7:
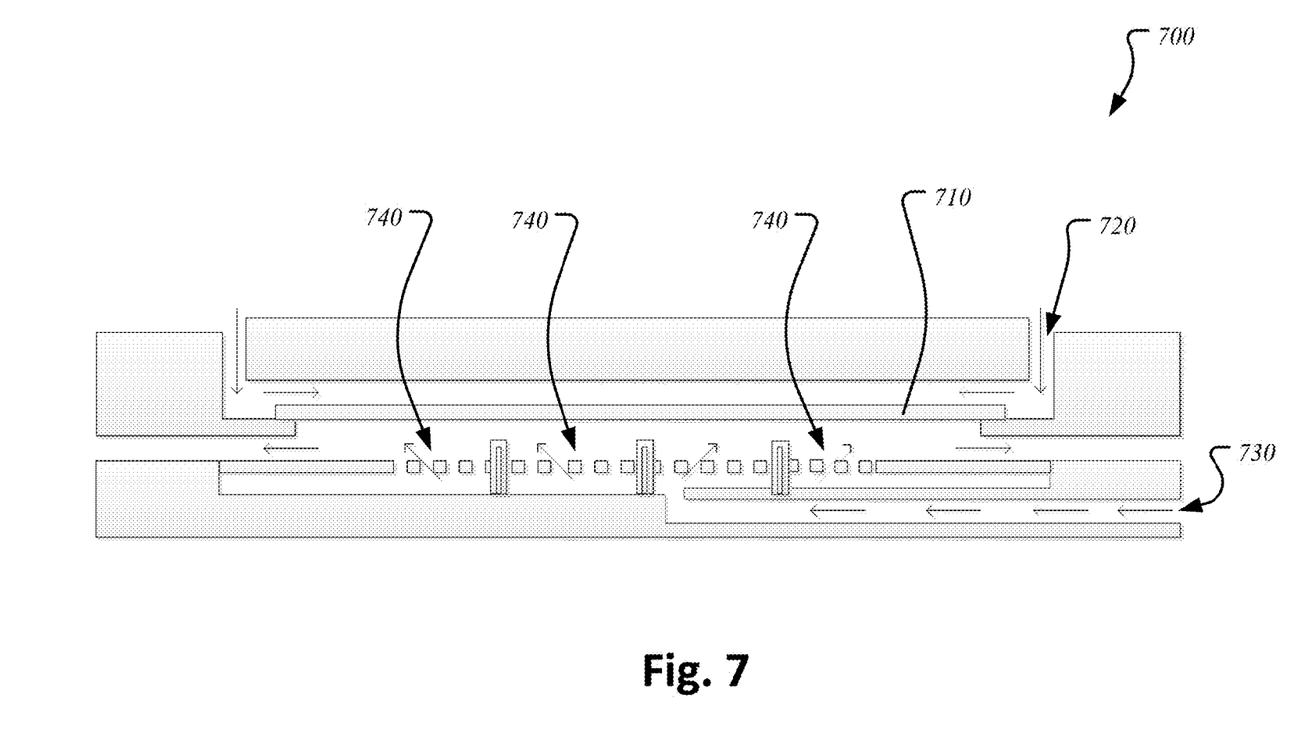
FIG. 7 illustrates a cross-sectional view of a processing chamber according to one embodiment.

In one embodiment, the wafer 210 may receiving the substrate in a processing tool, such as the processing apparatus disclosed in FIG. 7. The substrate includes a front side surface and a backside surface opposite to the front side surface. The front side surface being where IC devices are formed by the manufacturing processes. The processing apparatus in FIG. 7 may be configured to form a low friction film layer 400 on the backside surface, forming a photoresist layer on the front side surface, and developing the photoresist layer. In one embodiment, the low friction film layer is formed on the backside of the wafer 210 prior to forming the photoresist layer on the front side of the wafer 210. In a second embodiment, the photoresist layer is formed on the wafer 210 prior to forming the low friction film 400 layer on the backside of the wafer 210.

The low friction film layer 400 includes an exposed surface that is opposite to the backside of the wafer 210. The exposed surface will be placed in contact with the chuck 220 when the wafer 210 is secured to the chuck 220 using the aforementioned chucking process. The exposed surface of the low friction film layer 400 has a coefficient of friction that is lower than a backside coefficient of friction for the backside surface prior to forming the low friction film layer 400. The low friction film layer 400 can be formed by exposing the backside surface to a fluorine-containing liquid or gas, and exposing the front side surface to a gas maintained at a higher pressure than the fluorine-containing gas or liquid. The higher pressure adjacent to the front side surface may prevent the low friction layer 400 from forming on the front side surface of the wafer 210. In this way, the low friction film layer 400 is limited to forming on the backside surface of the wafer 210.

In one embodiment, the low friction film layer 400 may be formed by applying a fluorochemical layer to the backside surface of a wafer to decrease friction between the wafer 210 and a chuck 220 during electrostatic or vacuum chucking process to pull the wafer 210 flush, or substantially flush, with the chuck 220. Exemplary fluorochemicals may include, but are not limited to, perfluorodecyltrichlorosilane, perfluorocthyltrichlorosilane, perfluorheptachlorosilane, perfluorobuthylchlorosilane, perfluoroooctyltriethoxysilane, perfluorodecyltriethoxysilane, perfluoroooctyltrimethoxysilane, perfluorodecyltrimethoxysilane, perfluorodecylmonochlorodimethylsilane, perfluorocthylmonochlorodimethylsilane, perfluorobuthylmonochlorodimethylsilane, perfluoroooctyltriethoxydimethylsilanee, perfluorodecylethoxydimethylsilane, perfluoroooctylmethoxydimethylsilane, or perfluorodecylmethoxydimethylsilane.

The fluorochemical layer can be formed by exposing the backside surface of the wafer to a first process gas being maintained at a first pressure, and exposing the front side surface to a second process gas being maintained at a second pressure that is less than the first pressure. A person of ordinary skill in the art could establish the pressure differential between the front side and the backside of the wafer 210 to limit the flourochemical layer to the backside of the wafer 210, without undue experimentation. The fluorochemical layer can also be formed by maintaining a fluorochemical gas proximate to the wafer at a sub-atmospheric pressure, or at an atmospheric or greater than atmospheric pressure. The fluorochemical layer can be formed by a molecular deposition process or a liquid molecular deposition process.

Figure 5A:
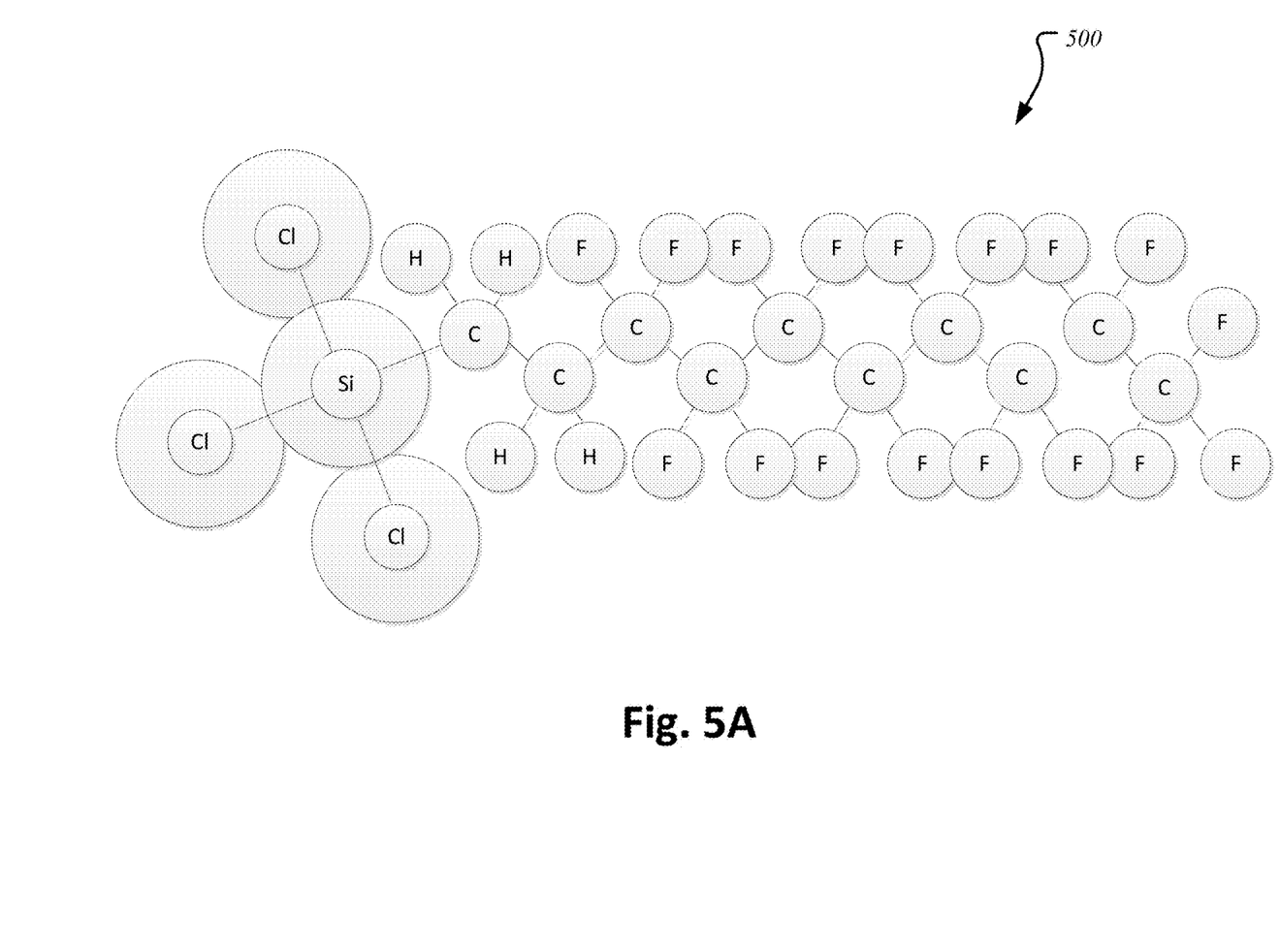
FIG. 5A illustrates a perfluorodecyltrichlorosilane (PFDS) molecule according to one embodiment.

FIG. 5A illustrates one embodiment of a molecule that may be used to apply a low friction film layer 400 on the backside of the wafer 210. The perfluorodecyltrichlorosilane (PFDS) molecule 500, which is also known as FDTS, which can be used with embodiments described herein. PFDS is a colorless liquid chemical with the molecular formula $C_{10}H_4Cl_3F_{17}Si$. PFDS molecules 500 form self-assembled monolayers that bond onto surfaces terminated with a hydroxyl (—OH) group. Removing the hydrogen bond from the surface increases the contact angle and thereby reduces the friction of the surface. The PFDS molecules 500 can attach to a bare silicon surface to increase the contact angle by decreasing the hydrogen bonding between surfaces.

In one embodiment, PFDS can be heated to achieve a higher vapor pressure and thereby shorten the processing time to apply the low friction film layer 400. Additionally, the PFDS layer may be removed from the wafer 210 using an $O_2$ plasma. In one embodiment, the PFDS layer can be removed within ten seconds of being exposed to an $O_2$ plasma. In another embodiment, perfluorooctyltriethoxysilane (PFOS) can also be used to apply the low friction film layer 400. PFOS can withstand a higher vapor pressure, which can shorten the processing time.

Figure 5B:
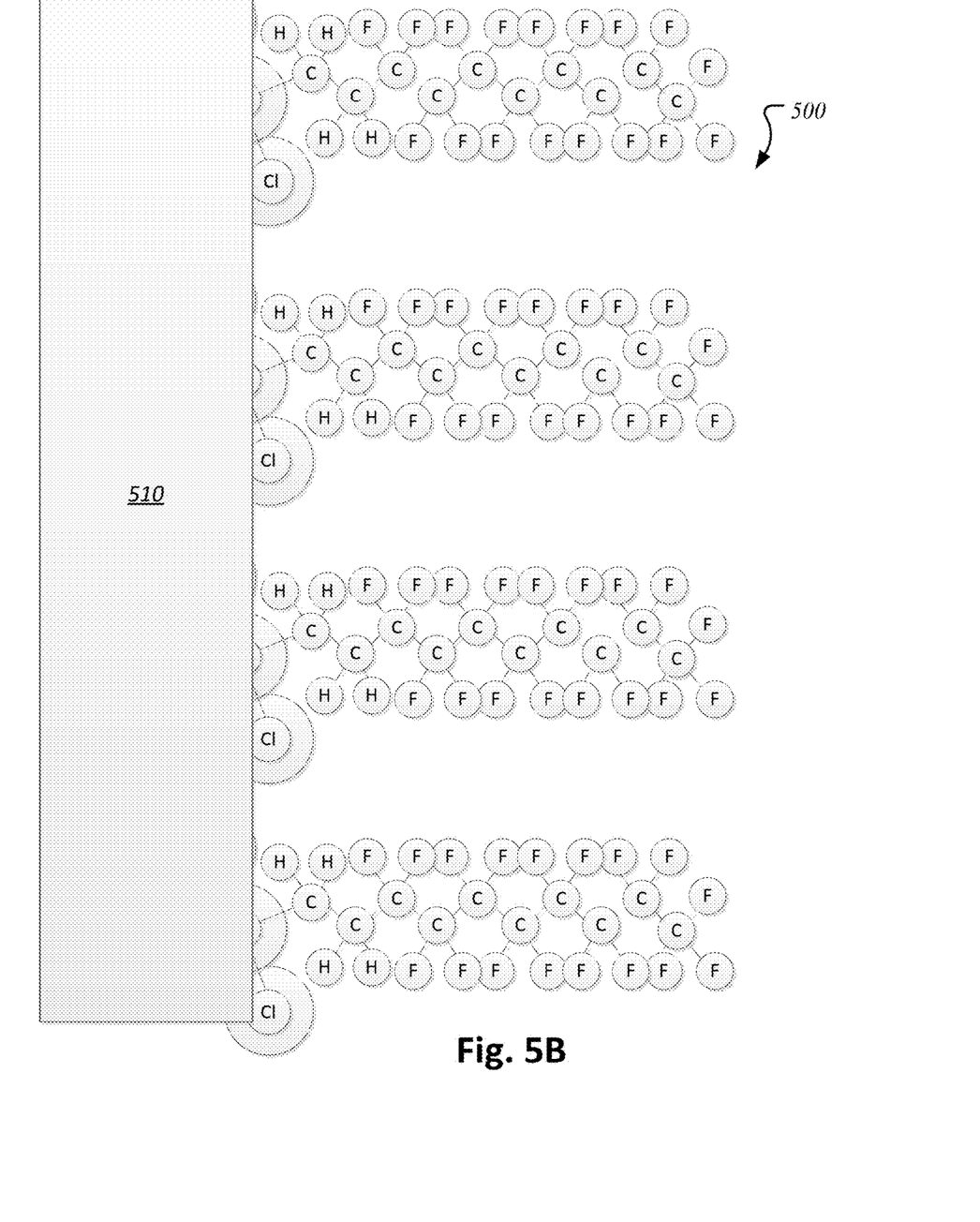
FIG. 5B illustrates a silicon wafer with PFDS molecules bonded to a silicon surface according to one embodiment.

FIG. 5B illustrates a silicon wafer 510 with PFDS molecules 500 bonded to the silicon surface at the tricholorosilane end of the PFDS molecules 500. The heavily fluorinated tail reduces surface energy. PFDS molecules 500 can be deposited by molecular vapor deposition (MVD) in a vacuum chamber, such as the apparatus illustrated in FIG. 7. PFDS molecules 500 can also be deposited by liquid molecular deposition.

The anti-friction effect of a fluorochemical coating can be increased by pre-treating a silicon surface. In tests conducted, a bare silicon wafer coated with a PFDS layer had a surface contact angle of approximately 70 degrees. When the bare silicon surface was pre-treated with deionized water, the surface contact angle was approximately 105 degrees. A humidity or spray chemical treatment, such as water, monoatomic oxygen, diatomic oxygen, or triatomic oxygen improved the contact angle of the fluorochemical coating. When the bare silicon surface was pretreated with an oxygen etch, the surface contact angle was approximately 110 degrees.

The PFOS and PFDS molecules, as suggested by their chemical names (e.g., . . . trichloro . . . , . . . trimethoxy . . . , . . . triethoxy . . . ), may include three reaction sites capable of interacting with other elements in the processing chamber. For example, the other elements, may include any element present on the surface of the substrate (e.g., silicon wafer 510), which is chemically reactive with the one or more reactive sites of the flourochemical molecules. However, the friction reduction techniques disclosed herein are not limited to molecules with three reaction sites and may include flourochemical molecules with one or more reaction sites capable of reacting with aforementioned other elements.

In another embodiment, the friction reduction techniques disclosed herein may be enabled by using flourochemical molecules with a single reaction site capable of chemically reacting with other elements within the process chamber. Broadly, the single reaction site flourochemical molecules may be identified based on their chemical structure, as suggested by their names (e.g., . . . trichloro . . . , . . . trimethoxy . . . , . . . triethoxy . . . ). In particular, the friction reductions techniques disclosed herein, may be enabled by using one or more of the following exemplary flourochemical molecules: perfluorodecylmonochlorodimethylsilane, perfluorocthylmonochlorodimethylsilane, perfluorobuthylmonochlorodimethylsilane, perfluoroooctyltriethoxydimethylsilanee, perfluorodecylethoxydimethylsilane, perfluoroooctylmethoxydimethylsilane, or perfluorodecylmethoxydimethylsilane. These exemplary molecules may be used to implement the low friction layer film 400 formed on the backside of the wafer 210 prior to forming the photoresist layer on the front side of the wafer 210.

Figure 6A:
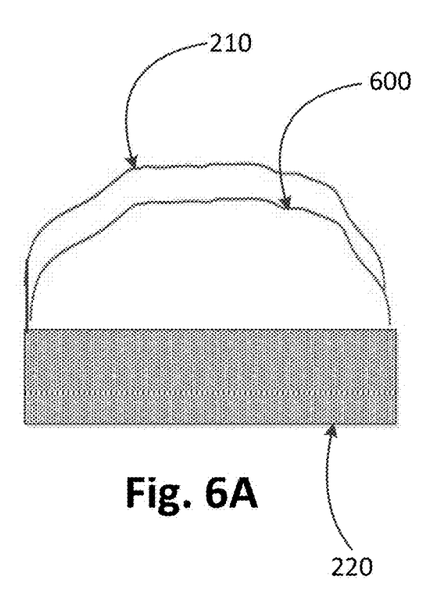
FIG. 6A illustrates a wafer with no backside treatment according to one embodiment.

FIG. 6A illustrates a wafer 210, such as bare silicon with no backside treatment. The wafer 210 tends to bow, as shown by the bow line 600, when an electrostatic charge or vacuum is applied by a chuck 220, wherein contact with the chuck 220 occurs at sparsely spaced contact points. The bow line 600 is an approximation of the severity of the bow across the wafer 210 indicating the severity of the deformation described in FIG. 2B. The severity of the wafer 210 deformation may be improved by applying the low friction layer film 400, as shown in FIG. 6B.

Figure 6B:
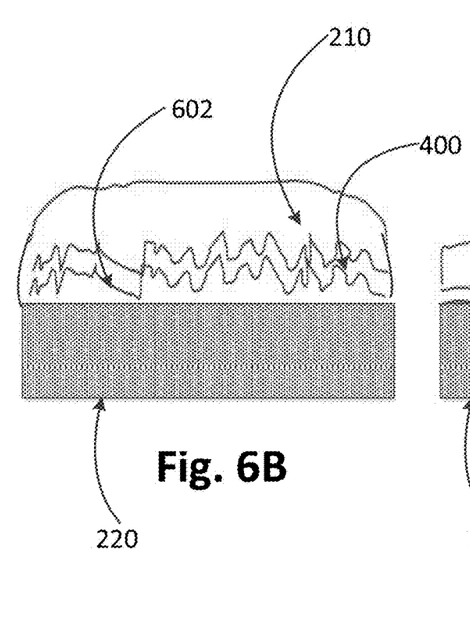
FIG. 6B illustrates a wafer with a backside fluorochemical coating according to one embodiment.

FIG. 6B illustrates the wafer 210 with a backside low friction layer film 400 (e.g., fluorochemical coating, such as PFDS), which enables a lower coefficient of friction between the wafer 210 and the chuck 220 than in the FIG. 6A embodiment. In contrast to the FIG. 6A embodiment, the wafer 210 in the FIG. 6B embodiment is enabled to have less deformation because the backside of the wafer 210 is less likely to be constrained as shown in FIG. 2B. By having fewer constrained regions, the wafer 210 in the FIG. 6B embodiment may have larger amount of the backside wafer surface in contact with the chuck 200 surface than in the FIG. 6A embodiment. In this way, a backside bow line 602 is flatter and more uniform across the wafer 210, indicating a lower amount of wafer 210 deformation, which leads to less pattern deformation (not shown) on the front side of the wafer. Accordingly, pattern misalignment or overlay errors for a subsequent patterning process will be reduced. However, additional embodiments may further improve the coefficient of friction between the wafer 210 and the chuck 220.

Figure 6C:
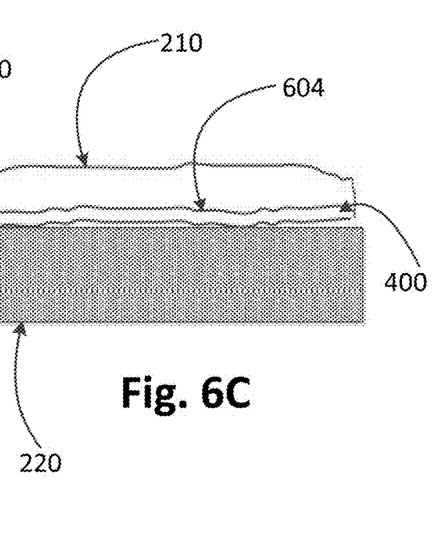
FIG. 6C illustrates a wafer with a pretreatment oxygen etch prior to applying a fluorochemical coating according to one embodiment.

FIG. 6C illustrates pre-treat bow line 604 for the wafer 210 with a pretreatment prior to applying the fluorochemical coating. The pretreatment may enable a more uniform application of the fluorochemical coating, further reducing thickness variation across the wafer 210, such that the coefficient of friction may be lowered even further, as indicated by the pre-treat bow line 604. In one embodiment, the pretreatment may include an oxygen etch to pre-treat the backside surface prior to applying the low friction film layer 400 (e.g., fluorochemical coating). The combination of an oxygen etch followed by application of a fluorochemical coating increases the contact angle to approximately 110 degrees. As illustrated in FIG. 6C, this greatly minimizes friction between the backside of the wafer and the surface of the chuck to provide maximum contact with the chuck, such that the wafer 210 bow is improved as indicated by the relatively flat pre-treat bow line 604. As a result, subsequent layers applied to the active side of the wafer can be overlaid with improved accuracy relative to previous layers applied to the wafer.

Table 1 lists properties of different films applied to a test structure. As illustrated, an uncoated test structure has a much higher friction, while FDTS and FOTS have a much lower friction.

TABLE 1

Frictional properties of films on a test structure.

| Coating | Cantilever beam length (μm) | Friction (μJ/m$^2$) | Coefficient of Friction |
|---|---|---|---|
| DDMS | 650 | 36 | 0.3 |
| FOTS | 1300 | 5 | 0.2 |
| FDTS | 1000 | 3 | 0.2 |
| Uncoated | 100 | 20,000 | 1.1 |

Table 2 list several pre-treatment compounds (vertical column) and corresponding layers (horizontal column) applied to a test structure. The contact angle is listed for each pair of pre-treatment compounds and applied layers.

TABLE 2

Contact angles for a pre-treatment compound and applied layer.

| Pre-treatment Compound | Applied Layer on Test Structure | | | | | | |
|---|---|---|---|---|---|---|---|
| | FDTS | FOTS | UTS | PETS | APTES | PEG6/9 | SiO$_2$ |
| Water | 109.6 | 98.2 | 95.0 | 88.0 | 58.0 | 36.0 | 10.0 |
| N-Methyl-pyrolidone | 80.5 | 55.0 | 44.6 | 14.7 | 17.8 | 10.0 | 10.0 |
| 1,2-Dichloro-benzene | 80.5 | 42.7 | 30.4 | 9.4 | 13.2 | 5.6 | 10.0 |
| Methanol | 74.5 | 24.8 | 23.3 | 6.2 | 6.4 | 4.8 | 5.3 |
| Chloroform | 68.8 | 30.0 | 22.9 | 7.3 | 7.3 | 7.6 | 10.0 |
| Toluene | 62.7 | 10.0 | 10.0 | 10.0 | 10.0 | 10.0 | 10.0 |
| Ethylacetate | 58.2 | 31.5 | 10.0 | 10.0 | 10.0 | 10.0 | 10.0 |
| n-Heptane | 52.9 | 20.5 | 16.6 | 10.4 | 10.0 | 10.0 | 10.5 |
| Isopropanol | 50.5 | 9.5 | 10.0 | 10.0 | 10.0 | 10.0 | 10.0 |
| Acetone | 45.2 | 10.0 | 4.9 | 10.0 | 10.0 | 6.4 | 10.0 |
| Fluorinert | 21.6 | 10.0 | 4.4 | 10.0 | 10.0 | 4.4 | 10.0 |

As illustrated in Table 2, a water pre-treatment followed by application of a FDTS layer provided the best contact angle. Good results, as shown in Table 2, were also obtained with a water pre-treatment followed by application of FOTS, UTS, or PETS layer.

FIG. 7 illustrates a cross-sectional view of a processing chamber 700 used with embodiments described herein. A wafer 710 is suspended along its perimeter, such that both the front side and the backside of the wafer 710 are exposed. In FIG. 7, a nitrogen purge inlet 720 flows across the front side of the wafer 710, while water vapor and a fluorochemical gas flow through an inlet port 730 and through channels 740 across the backside of the wafer 710. The nitrogen flows across the front side of the wafer 710 at a higher pressure, while the fluorochemical gas flows across the backside of the wafer 710 at a lower pressure. The water vapor is heated to approximately 40 degrees C., but no hotplate is required.

It may be desirable to remove the fluorochemical coating from the backside of the wafer prior to proceeding to the next processing step. This may be due to incompatibility of the fluorochemical coating with subsequent processing materials or equipment. It may also be desirable to remove the fluorochemical coating prior to proceeding to the next processing step because the fluorochemical coating may have been damaged and therefore, it is not adequate to function as a backside non-stick surface for the next processing step.

Post-treatment stages for removing the fluorochemical coating from the backside of the wafer include exposing the fluorochemical coating to an oxygen-containing gas, an oxygen-containing plasma, or a combination of an oxygen-containing gas and an ultra-violet light. For example, an $O_2$ plasma, an $O_2$ ash, or an ultra-violet ozone atmosphere can be used to remove the fluorochemical coating.

A first system used with embodiments described herein includes a substrate handling component that can transfer a substrate within the system, such as exemplary processing system PS illustrated in FIG. 1. The first system also includes a dispense module that can coat a first portion of the substrate with a light-sensitive film and a deposition module that can deposit a coating film on a second portion of the substrate that is opposite from the first portion of the substrate. The first system also includes an etch module that can remove the coating film from the substrate. The etch module can include a plasma source electrode or ultra-violet light source. The etch module can include a gas delivery component that can transfer an oxygen-containing gas. The first system also includes a developing module that can develop the light-sensitive film on the substrate. The deposition module can include a fluorochemical source component and/or a heating element that can heat a gas or liquid in the fluorochemical source component.

A second system used with embodiments described herein includes a substrate handling component that can transfer a substrate within the second system, such as exemplary processing system PS illustrated in FIG. 1. The substrate has a front side surface and a backside surface opposite to the front side surface. The second system also includes a dispensing module configured to apply a first film to the front side surface of the substrate and a deposition module configured to apply a second film on the backside surface of the substrate, wherein the second film has a composition different from the first film. The second system also includes an etch module configured to remove the first film or the second film. The second film layer includes a fluorochemical element, such as perfluorodecyltrichlorosilane, perfluorocthyltrichlorosilane, perfluorheptachlorosilane, perfluorobuthylchlorosilane, perfluoroooctyltriethoxysilane, perfluorodecyltriethoxysilane, perfluoroooctyltrimethoxysilane, perfluorodecyltrimethoxysilane, perfluorodecylmonochlorodimethylsilane, perfluorocthylmonochlorodimethylsilane, perfluorobuthylmonochlorodimethylsilane, perfluoroooctyltriethoxydimethylsilane, perfluorodecylethoxydimethylsilane, perfluoroooctylmethoxydimethylsilane, or perfluorodecylmethoxydimethylsilane.

A third system used with embodiments described herein includes a semiconductor substrate handling component configured to transfer a substrate within the third system, such as exemplary processing system PS illustrated in FIG. 1. The substrate includes a front side surface and a backside surface opposite to the front side surface. The third system also includes a dispense module having a liquid dispensing component, a deposition module having a vapor delivery system, and an etch module having a gas delivery system.

The aforementioned systems may be controlled and operated by using an exemplary computing device 800 used in accordance with embodiments herein is described with reference to FIG. 8. Delivery systems 150 is used for delivering a first gas source to the processing chamber, such as nitrogen port 720. Delivery system$_2$ 160 is used for delivering a second gas source to the processing chamber, such as the water vapor and fluorochemical gas port 730. Vacuum system 120 controls the vacuum parameters to the processing chamber.

Computing device 800 is intended to represent various forms of digital hardware, such as laptops, desktops, workstations, personal digital assistants, servers, blade servers, mainframes, and other appropriate computers. The components shown here, their connections and relationships, and their functions are meant to be examples only and are not meant to be limiting.

The computing device 800 includes a processor 801, a memory 802, a storage device 804, a high-speed interface 812 connecting to the memory 802 and multiple high-speed expansion ports 816, and a low-speed interface 810 connecting to a low-speed expansion port 814 and the storage device 804. Each of the processor 801, the memory 802, the storage device 804, the high-speed interface 812, the high-speed expansion ports 816, and the low-speed interface 810 are interconnected using various busses, such as communication bus 826, and may be mounted on a common motherboard or in other manners as appropriate.

The processor 801 can process instructions for execution within the computing device 800, including instructions stored in the memory 802 or on the storage device 804 to display graphical information for a GUI on an external input/output device, such as a display 808 coupled to the high-speed interface 812. In other implementations, multiple processors and/or multiple buses may be used, as appropriate, along with multiple memories and types of memory. Also, multiple computing devices may be connected, with each device providing portions of the necessary operations (e.g., as a server bank, a group of blade servers, or a multi-processor system). The memory 802 stores information within the computing device 800. In some implementations, the memory 802 is a volatile memory unit or units. In some implementations, the memory 802 is a non-volatile memory unit or units. The memory 802 can also be another form of computer-readable medium, such as a magnetic or optical disk.

The storage device 804 is capable of providing mass storage for the computing device 800. In some implementations, the storage device 804 can be or contain a computer-readable medium, such as a floppy disk device, a hard disk device, an optical disk device, a tape device, a flash memory or other similar solid state memory device, or an array of devices, including devices in a storage area network or other configurations. Instructions can be stored in an information carrier. The instructions, when executed by one or more processing devices (for example, processor 801), perform one or more methods, such as those described above. The instructions can also be stored by one or more storage devices, such as computer- or machine-readable mediums (for example, the memory 802, the storage device 804, or memory on the processor 801).

The high-speed interface 812 manages bandwidth-intensive operations for the computing device 800, while the low-speed interface 810 manages lower bandwidth-intensive operations. Such allocation of functions is an example only. In some implementations, the high-speed interface 812 is coupled to the memory 802, the display 808 (e.g., through a graphics processor or accelerator), and to the high-speed expansion ports 816, which may accept various expansion cards (not shown). In the implementation, the low-speed interface 810 is coupled to the storage device 804 and the low-speed expansion port 814. The low-speed expansion port 814, which can include various communication ports (e.g., USB, Bluetooth, Ethernet, wireless Ethernet) can be coupled to one or more input/output devices 818, such as a keyboard, a pointing device, a scanner, or a networking device such as a switch or router, e.g., through a network adapter.

The computing device 800 also includes a network controller 806, such as an Intel Ethernet PRO network interface card from Intel Corporation of America, for interfacing with a network 99. As can be appreciated, the network 99 can be a public network, such as the Internet, or a private network such as an LAN or WAN network, or any combination thereof and can also include PSTN or ISDN sub-networks. The network 99 can also be wired, such as an Ethernet network, or can be wireless such as a cellular network including EDGE, 3G and 4G wireless cellular systems. The wireless network can also be Wi-Fi, Bluetooth, or any other wireless form of communication that is known.

Figure 8:
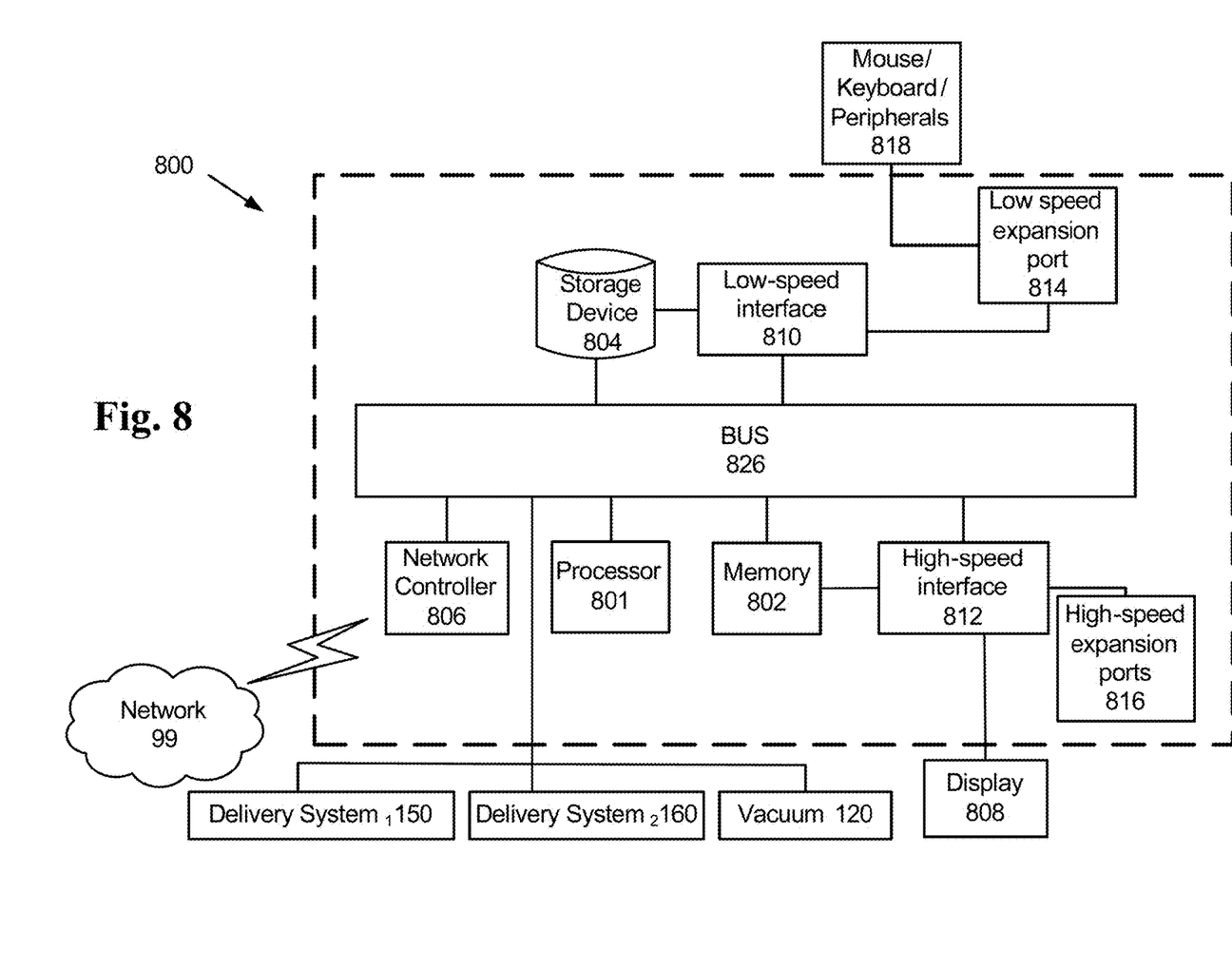
FIG. 8 is a block diagram of an exemplary computing device according to one embodiment.

Although the computing device 800 of FIG. 8 is described as having a storage medium device 804, the claimed advancements are not limited by the form of the computer-readable media on which the instructions of the described processes are stored. For example, the instructions can be stored on CDs, DVDs, in FLASH memory, RAM, ROM, PROM, EPROM, EEPROM, hard disk, or any other information processing device with which the computing device communicates.

In other alternate embodiments, processing features according to the present disclosure may be implemented and commercialized as hardware, a software solution, or a combination thereof. Moreover, instructions corresponding to processes described herein could be stored in a portable drive, such as a USB Flash drive that hosts a secure process.

Computer programs (also known as programs, software, software applications, or code) associated with the processes described herein include machine instructions for a programmable processor, and can be implemented in a high-level procedural and/or object-oriented programming language, and/or in assembly/machine language. As used herein, the terms machine-readable medium and computer-readable medium refer to any computer program product, apparatus, and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term machine-readable signal refers to any signal used to provide machine instructions and/or data to a programmable processor.

To provide for interaction with a user, the systems and techniques described herein can be implemented on a computer having a display device 808 (e.g., a CRT (cathode ray tube) or LCD (liquid crystal display) monitor) for displaying information to the user and a keyboard and a pointing device 818 (e.g., a mouse or a trackball) by which the user can provide input to the computer. Other kinds of devices can be used to provide for interaction with a user as well. For example, feedback provided to the user can be any form of sensory feedback (e.g., visual feedback, auditory feedback, or tactile feedback), and input from the user can be received in any form, including acoustic, speech, or tactile input.

The systems and techniques described herein can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network (LAN), a wide area network (WAN), and the Internet.

The computing system can include clients and servers. A client and server are generally remote from each other and typically interact through a communication network. The relationship of client and server arises by virtue of computer programs running on the respective computers and having a client-server relationship to each other.

Figure 9:
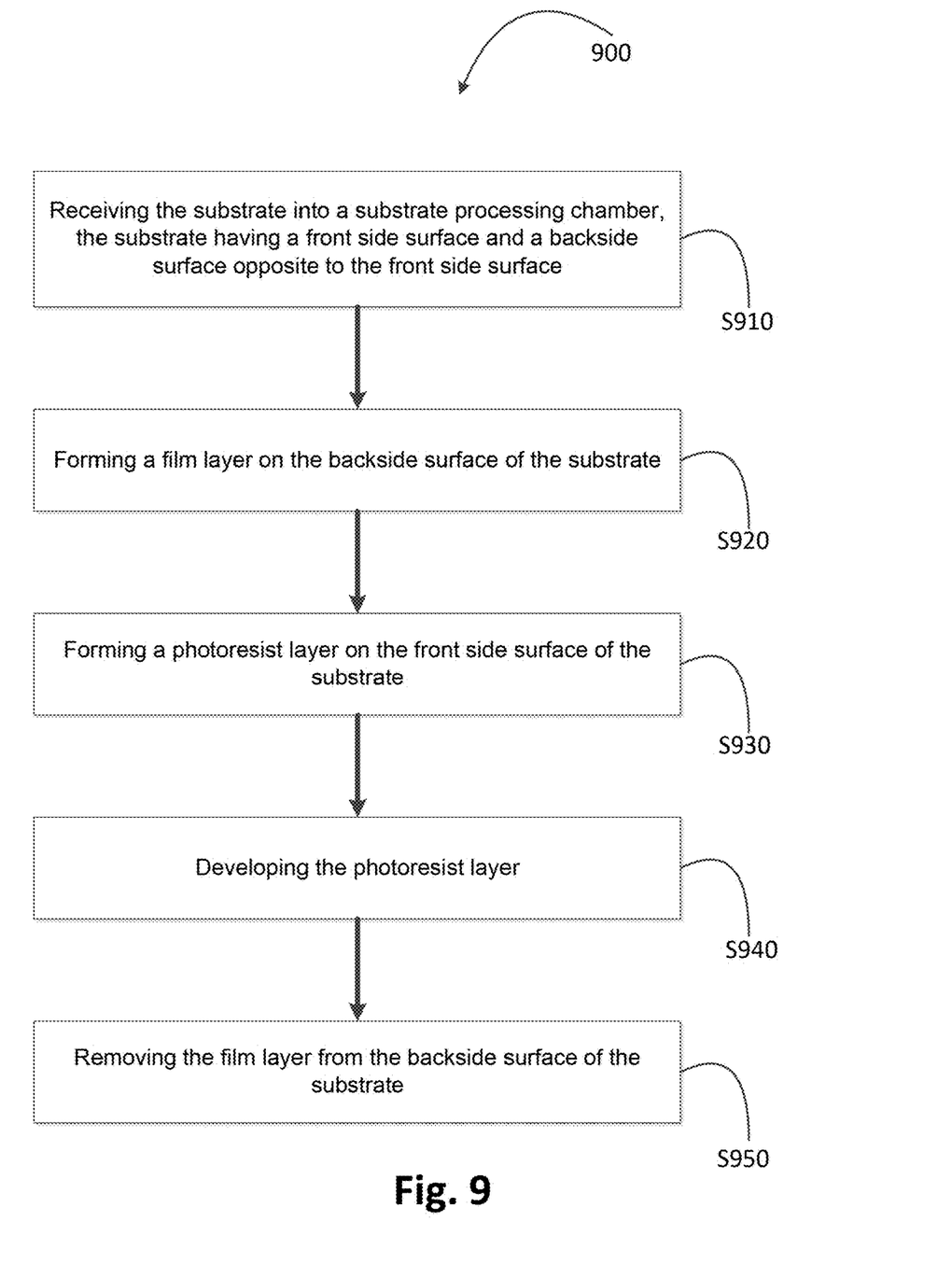
FIG. 9 is a flowchart for an exemplary method of treating a substrate according to one embodiment.

FIG. 9 is a flowchart for an exemplary method 900 of treating a substrate. In step S910, the substrate is received into a substrate processing chamber. The substrate 210 has a front side surface and a backside surface opposite to the front side surface. The substrate 210 may include patterned features of microelectronic devices covered by one or more films layers used to transfer patterns to the substrate 210. The method 900 is one embodiment for minimizing patterning errors or overlay errors during the patterning process. Although the method 900 is described in sequential order, it would be possible to change the order and/or omit portions of the steps in other embodiments.

In step S920, a film layer is formed on the backside surface of the substrate. Prior to forming the film layer on the backside surface, the backside surface of the substrate has a first coefficient of friction prior to forming the film layer and the film layer formed on the backside surface of the substrate has a second coefficient of friction, wherein the second coefficient of friction is lower than the first coefficient of friction. In one embodiment, the film layer is a fluorochemical layer, such as perfluorodecyltrichlorosilane, perfluorocthyltrichlorosilane, perfluorheptachlorosilane, perfluorobuthylchlorosilane, perfluoroooctyltriethoxysilane, perfluorodecyltriethoxysilane, perfluoroooctyltrimethoxysilane, perfluorodecyltrimethoxysilane, perfluorodecylmonochlorodimethylsilane, perfluorocthylmonochlorodimethylsilane, perfluorobuthylmonochlorodimethylsilane, perfluoroooctyltriethoxydimethylsilane, perfluorodecylethoxydimethylsilane, perfluoroooctylmethoxydimethylsilane, or perfluorodecylmethoxydimethylsilane. Broadly, the fluorochemical layer may reduce the coefficient of friction of the substrate's 210 backside surface to minimize wafer distortion as described in the description of FIGS. 2A-2B.

The backside layer may be formed by exposing the backside surface to a fluorine-containing liquid or gas; and exposing the front side surface to a gas maintained at a higher pressure than the fluorine-containing gas or liquid. The film layer (e.g., low friction film layer 400) can be coated or deposited on backside of the substrate 210 using the apparatus illustrated in FIG. 7. The backside film may be deposited using chemical vapor deposition, molecular vapor deposition, molecular liquid deposition, or any film deposition or coating technique.

In step S930, a photoresist layer is formed on the front side surface of the substrate 210. In one embodiment, the front side surface is maintained at a higher pressure than a fluorine-containing gas on the backside surface.

In step S940, the photoresist layer is exposed and developed to form a pattern on the substrate 210. In step S950, the film layer is removed from the backside surface of the substrate 210 following the patterning step(s) in one embodiment. However, in other embodiments, the film layer removal step may not be required in certain instances. But, the film layer may be removed by exposing the film layer to an oxygen-containing gas, exposing the film layer to an oxygen-containing plasma, or exposing the film layer to a combination of an oxygen-containing gas and ultra-violet light.

In step S960, method 900 also includes exposing the backside surface to a chemistry treatment prior to the forming a film layer on the backside surface. The chemistry treatment includes one of water, monoatomic oxygen, diatomic oxygen, or triatomic oxygen. The liquid pretreatment processes may done using existing liquid dispense equipment or semiconductor wafer cleaning equipment known to a person of ordinary skill in the art. The gas pretreatments may be implemented using the apparatus or a similar backside treatment apparatus to expose pretreatment chemistry to the backside of the substrate 210. However, in some embodiments, the pre-treatment of the backside surface of the substrate 210 may be omitted.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate or wafer may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate or wafer is not limited to any particular base structure, underlying layer or overlying layer, patterned or un-patterned, but rather, is contemplated to include any such layer or base structure, and any combination of layers and/or base structures. The description may reference particular types of substrates or wafers, but this is for illustrative purposes only.

Embodiments described herein provide advantages over conventional systems and processes, wherein overlay alignment of multiple layers are more closely aligned with previously deposited layers. This provides a more accurate photolithography process.

Embodiments described herein include the following aspects.

(1) A method of treating a substrate, the method including receiving the substrate into a substrate processing chamber, the substrate having a front side surface and a backside surface opposite to the front side surface; forming a film layer on the backside surface of the substrate; forming a photoresist layer on the front side surface of the substrate; developing the photoresist layer; and removing the film layer from the backside surface of the substrate.

(2) The method of treating a substrate of (1), wherein the backside surface of the substrate has a first coefficient of friction prior to forming the film layer, the film layer formed on the backside surface of the substrate has a second coefficient of friction, and the second coefficient of friction is lower than the first coefficient of friction.

(3) The method of treating a substrate of either (1) or (2), wherein the film layer comprises a fluorochemical layer.

(4) The method of treating a substrate of any one of (1) through (3), wherein the fluorochemical layer comprises one of perfluorodecyltrichlorosilane, perfluorocthyltrichlorosilane, perfluorheptachlorosilane, perfluorobuthylchlorosilane, perfluoroooctyltriethoxysilane, perfluorodecyltriethoxysilane, perfluoroooctyltrimethoxysilane, perfluorodecyltrimethoxysilane, perfluorodecylmonochlorodimethylsilane, perfluorocthylmonochlorodimethylsilane, perfluorobuthylmonochlorodimethylsilane, perfluoroooctyltriethoxydimethylsilane, perfluorodecylethoxydimethylsilane, perfluoroooctylmethoxydimethylsilane, or perfluorodecylmethoxydimethylsilane.

(5) The method of treating a substrate of any one of (1) through (4), wherein the forming a film layer includes exposing the backside surface to a fluorine-containing liquid or gas; and exposing the front side surface to a gas maintained at a higher pressure than the fluorine-containing gas or liquid.

(6) The method of treating a substrate of any one of (1) through (5), wherein the forming a film layer comprises molecular vapor deposition or molecular liquid deposition.

(7) The method of treating a substrate of any one of (1) through (6), wherein the removing a film layer comprises one of exposing the film layer to an oxygen-containing gas, exposing the film layer to an oxygen-containing plasma, or exposing the film layer to a combination of an oxygen-containing gas and ultra-violet light.

(8) The method of treating a substrate of any one of (1) through (7), further including exposing the backside surface to a chemistry treatment prior to the forming a film layer on the backside surface, wherein the chemistry treatment includes one of water, monoatomic oxygen, diatomic oxygen, or triatomic oxygen.

(9) The method of treating a substrate of any one of (1) through (8), further including securing the substrate to a substrate chuck after forming the film layer onto the backside surface of the substrate, wherein a first measured coefficient of friction of the substrate prior to forming the film layer onto the backside surface is greater than a second measured coefficient of friction of the substrate after the film layer is formed onto the backside surface.

(10) The method of treating a substrate of any one of (1) through (9), wherein a first bowing of the substrate having the film layer adhered to the backside surface of the substrate is less than a second bowing of the substrate without the film layer adhered to the backside surface when the substrate is secured to a chuck during the first bowing and the second bowing.

(11) method of treating a substrate of any one of (1) through (10), wherein a first distortion of the substrate having the film layer adhered to the backside surface of the substrate is less than a second distortion of the substrate without the film layer adhered to the backside surface when the substrate is secured to a chuck during the first distortion and the second distortion.

(12) The method of treating a substrate of any one of (1) through (11), wherein developing the photoresist layer occurs subsequent to exposure of the photoresist layer to a pattern of actinic radiation, and wherein the film layer on the backside surface of the substrate is formed prior to the exposure of the photoresist layer to the pattern of actinic radiation.

(13) A substrate including a substrate having a front side surface and a backside surface opposite to the front side surface, wherein a bare backside surface of the substrate has a first coefficient of friction; and a film layer formed onto the backside surface of the substrate, wherein the film layer formed on the backside surface of the substrate has a second coefficient of friction and the second coefficient of friction is lower than the first coefficient of friction.

(14) The substrate of (13), wherein a first measured distortion of the substrate having the bare backside surface is greater than a second measured distortion of the substrate with the film layer formed on the backside surface when the substrate is secured to a substrate chuck during the first measured distortion and the second measured distortion.

(15) The substrate of either (13) or (14), wherein the film layer comprises one of perfluorodecyltrichlorosilane, perfluorocthyltrichlorosilane, perfluorheptachlorosilane, perfluorobuthylchlorosilane, perfluoroooctyltriethoxysilane, perfluorodecyltriethoxysilane, perfluoroooctyltrimethoxysilane, perfluorodecyltrimethoxysilane, perfluorodecylmonochlorodimethylsilane, perfluorocthylmonochlorodimethylsilane, perfluorobuthylmonochlorodimethylsilane, perfluoroooctyltriethoxydimethylsilane, perfluorodecylethoxydimethylsilane, perfluoroooctylmethoxydimethylsilane, or perfluorodecylmethoxydimethylsilane.

(16) A processing chamber system including a substrate mounting module configured to secure a substrate within a first processing chamber; a first deposition module configured to apply a light-sensitive film to a front side surface of the substrate; and a second deposition module configured to apply a film layer to a backside surface of the substrate, wherein the front side surface is opposite to the backside surface of the substrate.

(17) The processing chamber system of (16), further including a substrate handler configured to transfer the substrate to one or more subsequent processing chambers; an etch module configured to remove the film layer applied to the bottom surface of the substrate; and a developing module configured to develop the light-sensitive film applied to the top surface of the substrate.

(18) The processing chamber system of either (16) or (17), wherein the first processing chamber is configured to expose the backside surface to a first process gas maintained at a first pressure and expose the front side surface to a second process gas being maintained at a second pressure, and the second pressure differs from the first pressure.

(19) The processing chamber system of any one of (16) through (18), wherein the first processing chamber is configured to deposit the first process gas to the backside surface in one of a molecular vapor deposition process or a molecular liquid deposition process.

(20) The processing chamber system of any one of (16) through (19), further including a pre-treatment processing chamber configured to expose the backside surface of the substrate to an oxygen-containing treatment chemistry prior to applying the film layer; and a post-treatment processing chamber configured to remove the film layer from the substrate, wherein the post-treatment processing chamber is further configured to remove the film layer via exposure to one of an oxygen-containing gas, an oxygen-containing plasma, or a combination of an oxygen-containing gas and ultra-violet light.

While certain embodiments have been described herein, these embodiments are presented by way of example only, and are not intended to limit the scope of the disclosure. Using the teachings in this disclosure, a person having ordinary skill in the art can modify and adapt the disclosure in various ways, making omissions, substitutions, and/or changes in the form of the embodiments described herein, without departing from the spirit of the disclosure. Moreover, in interpreting the disclosure, all terms should be interpreted in the broadest possible manner consistent with the context. The accompanying claims and their equivalents are intended to cover such forms or modifications, as would fall within the scope and spirit of the disclosure.

The invention claimed is:

1. A method of treating a substrate, the method comprising:

receiving the substrate into a substrate processing chamber, the substrate having a front side surface and a backside surface opposite to the front side surface;

forming a flourochemical film layer on the backside surface of the substrate based, at least in part, on exposing the backside surface to a fluorine-containing liquid or gas, and exposing the front side surface to a gas maintained at a higher pressure than the fluorine-containing gas or liquid, the backside surface of the substrate has a first coefficient of friction prior to forming the film layer, the film layer formed on the backside surface of the substrate has a second coefficient of friction, the second coefficient of friction is lower than the first coefficient of friction, forming a photoresist layer on the front side surface, wherein developing the photoresist layer subsequent to exposure of the photoresist layer to a pattern of actinic radiation, wherein the film layer on the backside surface of the substrate is formed prior to the exposure of the photoresist layer to the pattern of actinic radiation, and wherein the flourochemical layer is entirely made of perfluorodecylmonochlorodimethylsilane, perfluorocthylmonochlorodimethylsilane, perfluorobuthylmonochlorodimethylsilane, perfluorodecylethoxydimethylsilane, perfluoroooctylmethoxydimethylsilane, or perfluorodecylmethoxydimethylsilane.

2. The method of claim 1, wherein the forming a film layer comprises molecular vapor deposition or molecular liquid deposition.

3. The method of claim 1, further comprising removing a film layer, wherein the removing the film layer comprises one of exposing the film layer to an oxygen-containing gas, exposing the film layer to an oxygen-containing plasma, or exposing the film layer to a combination of an oxygen-containing gas and ultra-violet light.

4. The method of claim 1, further comprising:

exposing the backside surface to a chemistry treatment prior to the forming a film layer on the backside surface, wherein the chemistry treatment includes one of water, monoatomic oxygen, diatomic oxygen, or triatomic oxygen.

5. The method of claim 1, further comprising:

securing the substrate to a substrate chuck after forming the film layer onto the backside surface of the substrate, wherein a first measured coefficient of friction of the substrate prior to forming the film layer on the backside surface is greater than a second measured coefficient of friction of the substrate after the film layer is formed on the backside surface.

6. The method of claim 5, wherein a first bowing of the substrate having the film layer adhered to the backside surface of the substrate is less than a second bowing of the substrate without the film layer adhered to the backside surface when the substrate is secured to a chuck during the first bowing and the second bowing.

7. The method of claim 5, wherein a first distortion of the substrate having the film layer adhered to the backside surface of the substrate is less than a second distortion of the substrate without the film layer adhered to the backside surface when the substrate is secured to a chuck during the first distortion and the second distortion.

* * * * *

UNITED STATES PATENT AND TRADEMARK OFFICE
CERTIFICATE OF CORRECTION

PATENT NO. : 10,504,715 B2
APPLICATION NO. : 15/826091
DATED : December 10, 2019
INVENTOR(S) : Hoyoung Kang It is certified that error appears in the above-identified patent and that said Letters Patent is hereby corrected as shown below:

In the Claims

In Column 17, Line 15, Claim 1, delete "flourochemical" and insert -- fluorochemical --, therefor.

In Column 17, Line 33, Claim 1, delete "flourochemical" and insert -- fluorochemical --, therefor.

In Column 17, Lines 34-35, Claim 1, delete "perfluorocthylmonochlorodimethylsilane," and insert -- perfluoroethylmonochlorodimethylsilane, --, therefor.

In Column 17, Lines 35-36, Claim 1, delete "perfluorobuthylmonochlorodimethylsilane," and insert -- perfluorobutylmonochlorodimethylsilane, --, therefor.

In Column 17, Line 37, Claim 1, delete "perfluoroooctylmethoxydimethylsilane," and insert -- perfluorooctylmethoxydimethylsilane, --, therefor.

Signed and Sealed this
Fifth Day of May, 2020

Andrei Iancu
*Director of the United States Patent and Trademark Office*